United States Patent [19]

Sakaba et al.

[11] 4,107,548
[45] Aug. 15, 1978

[54] RATIOLESS TYPE MIS LOGIC CIRCUIT

[75] Inventors: Hiroo Sakaba, Kodaira; Kenzo Masuda, Tokorozawa, both of Japan

[73] Assignee: Hitachi, Ltd., Japan

[21] Appl. No.: 774,540

[22] Filed: Mar. 4, 1977

[30] Foreign Application Priority Data

Mar. 5, 1976 [JP] Japan .................................. 51-23333
Mar. 5, 1976 [JP] Japan .................................. 51-23334

[51] Int. Cl.² ..................... H03K 19/08; H03K 19/20; G11C 17/04
[52] U.S. Cl. ................................ 307/205; 307/200 B; 307/207; 307/213; 307/215; 357/23; 365/104
[58] Field of Search ................... 307/205, 200 B, 207, 307/215, 213, 221; 365/94, 104

[56] References Cited

U.S. PATENT DOCUMENTS

| | | | |
|---|---|---|---|
| 3,518,451 | 6/1970 | Booher | 307/221 C |
| 3,567,968 | 3/1971 | Booher | 307/205 X |
| 3,702,945 | 11/1972 | Faith et al. | 307/221 C X |
| 3,866,186 | 2/1975 | Suzuki | 307/205 X |
| 4,016,430 | 4/1977 | Kanezuka | 307/205 |
| 4,040,015 | 8/1977 | Fukuda | 307/207 X |

*Primary Examiner*—Larry N. Anagnos
*Attorney, Agent, or Firm*—Craig & Antonelli

[57] ABSTRACT

A ratioless type MIS logic circuit comprises a logic block including at least one depletion mode FET inherently having a gate-to-source parasitic capacitance and a gate-to-drain parasitic capacitance, an output capacitance, a circuit for precharging the output capacitance and depletion mode clamping FETs connected one with each of the two ends of the logic block, the clamping FETs having their gates connected with a reference potential and the threshold voltage value of the FET in the logic block being larger than those of the clamping FETs.

5 Claims, 20 Drawing Figures

GATE-TO-SOURCE VOLTAGE $V_{GS}$

RATIOLESS TYPE MIS LOGIC CIRCUIT

The present invention relates to a ratioless MIS logic circuit.

A logic circuit using the FETs has been widely used in digital electronic equipment such as electronic computers since it can be more readily integrated in a single semiconductor substrate than a logic circuit using bipolar transistors. A so-called MIS logic circuit which is suitable for the construction in the form of a semiconductor IC device has been developed with the view to integrating the logic circuit in a semiconductor substrate.

In copending patent application Ser. Nos. 611,891 filed Sept. 10, 1975 and 634,772 filed Nov. 24, 1975, and assigned to the assignee of the present invention, is proposed an MIS logic circuit including a combination of depletion mode FETs and enhancement mode FETs which circuit may be readily formed in a geometrical matrix layout at a high density. In this MIS logic circuit, a logic circuit unit includes a series connection of enhancement mode FETs and depletion mode FETs wherein the enhancement mode FETs are turned on and off depending upon the operating voltage while the depletion mode FETs always remain in on state. With this structure, an MIS logic circuit formed in a single semiconductor substrate at a very high integration density may be obtained. Further, since the MIS logic circuit can be simply and easily fabricated, its reliability and fabrication yield are much improved. More particularly, with this structure in which enhancement mode FETs and depletion mode FETs are arranged in matrix form, aluminum wiring layers for multi-layer wiring can be eliminated and moreover such multi-layer wiring configuration is unnecessary even at the cross points of the source or drain regions and conductor layers such as polycrystal silicon layers serving as gate electrodes. Furthermore, in the above-mentioned MIS logic circuit since the drain regions of the FETs are also used as the source regions of the adjacent FETs, there is no need of connection of the drains with the ground line or with the aluminum layer through contact holes for multi-layer wiring required in the conventional MIS logic circuit layout.

However, the present inventors have found that if such an MIS logic circuit as having the above-described structure is adapted for the multi-phase ratioless type drive system to decrease its power consumption, the following problem is presented.

Namely, the so-called gate capacitance having a rather large value exists between the gate as an input terminal and the source or the drain as an output terminal of the depletion mode FET or of the enhancement mode FET. The precharge signal on the output side (logical output terminal) is fed back to the input side through the gate capacitance and affects the level of the input signal in the floating state so that erroneous operation is caused.

It is therefore one object of the present invention to provide an MIS logic circuit of a ratioless type in which the influence of the precharge voltage upon the floating level of the input is suppressed.

It is another object of the present invention to provide a ratioless type MIS logic circuit which has a wide tolerance to the range of operating power source voltage, the range of the operating frequency of the clock pulse signals and the range of the operating temperature.

It is another object of the present invention to provide a ratioless type MIS logic circuit which can be readily fabricated by semiconductor integrated circuit technology and can be integrated in a single semiconductor substrate at a high packing density.

It is another object of the present invention to provide a semiconductor IC device useful for making such a ratioless type MIS logic circuit as referred to above.

Furthermore, in designing a logic circuit in an IC form using FETs having excellent performance characteristics with a large freedom of design, it is desirable to use FETs having different threshold voltage values.

It is, therefore, another object of the present invention to provide a process for fabricating a semiconductor IC device in which a plurality of FETs having different threshold voltage values.

It is another object of the present invention to provide a process for a semiconductor IC device useful for making such a ratioless type MIS logic circuit as referred to above.

Other objects, features and advantages of the present invention will be apparent from the following description of some embodiments of the present invention with reference to the accompanying drawings, in which.

For a better understanding of the present invention, problems encountered with the circuits disclosed in the above-mentioned co-pending U.S. applications will be described with reference to FIGS. 1-3, prior to the description on the embodiments of the present invention.

Figure 1:
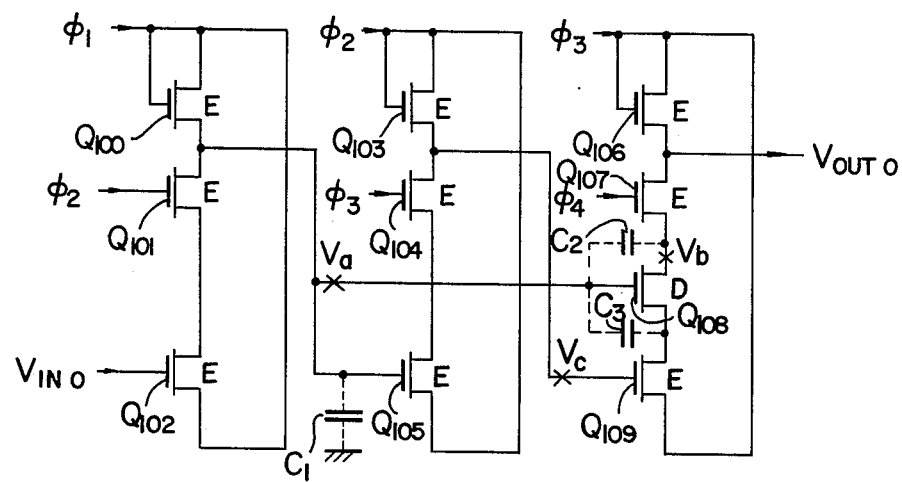
FIG. 1 is a circuit diagram of an example of a ratioless type logic circuit.
Figure 2:
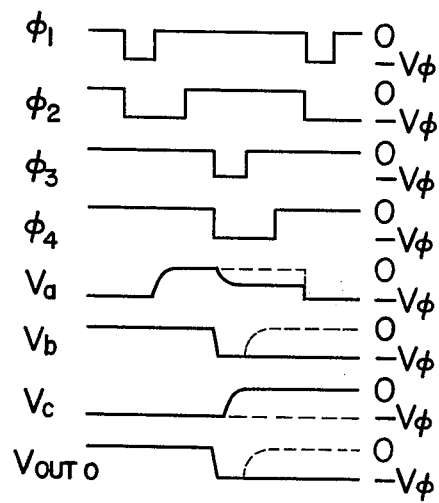
FIG. 2 is a waveform diagram useful for explaining the operation of the circuit shown in FIG. 1.

As shown in FIG. 1, a logic block of a serial access type includes a P-channel depletion mode FET $Q_{108}$ and a P-channel enhancement mode FET $Q_{109}$, which are arranged to receive signals in opposite phase. (The depletion and enhancement modes are represented by "D" and "E", respectively, in the drawings.) Namely, a signal $V_a$ produced according to clock pulse signals $\phi_1$ and $\phi_2$ by a first inverter including P-channel enhancement mode FETs $Q_{100}$–$Q_{102}$ is applied to the FET $Q_{108}$ while a signal $V_c$ produced according to clock pulse signals $\phi_2$ and $\phi_3$ by a second inverter including P-channel enhancement mode FETs $Q_{103}$–$Q_{105}$ is applied to the FET $Q_{109}$. If an input signal $V_{INO}$ is at a low level (low enough to make the transistor $Q_{102}$ conductive or ON) under the above conditions, the output $V_a$ of the first inverter ($Q_{100}$–$Q_{102}$), i.e. a first input signal to the logic block is made to assume a high level (0 volt) in the floating state according to the pulse signal $\phi_2$. This first input signal $V_a$ is, in principle, supposed to remain at the high level, as indicated by the dotted line, and the second inverter for producing the inverted version of the signal $V_a$ is precharged by the pulse signal $\phi_2$ and ought to deliver an inverted signal or a second input signal $V_c$ according to the pulse signal $\phi_3$, as indicated by the dotted line. Actually, however, at the time when the pulse signal $\phi_3$ is applied as shown, not only the logic block ($Q_{108}$–$Q_{109}$) is precharged but also the input load capacitance $C_1$ is charged through the gate capacitances ($C_2$ and $C_3$) of the FET $Q_{108}$ with a result that the first and second input signals $V_a$ and $V_c$ change as illustrated by the solid lines rather than by the dotted lines. If, for example, $C_1 = C_2 + C_3$, the voltage to which the capacitance $C_1$ is charged will be $\frac{1}{2} V\phi$ ($V\phi$: the precharging voltage), so that the first input signal $V_a$ is driven to a low level ($\frac{1}{2} V\phi$ volts). If the absolute value ($\frac{1}{2} V\phi$) of this first input signal $V_a$ is greater than the threshold voltage value of the FET $Q_{105}$, the latter is rendered ON to make its output signal $V_c$ to the high level as illustrated by the solid line. Therefore, for the input signal $V_{INO}$ at the low level ($-V\phi$ volts), the output signal $V_{OUTO}$ assumes the low level, which causes an erroneous operation.

Figure 3:
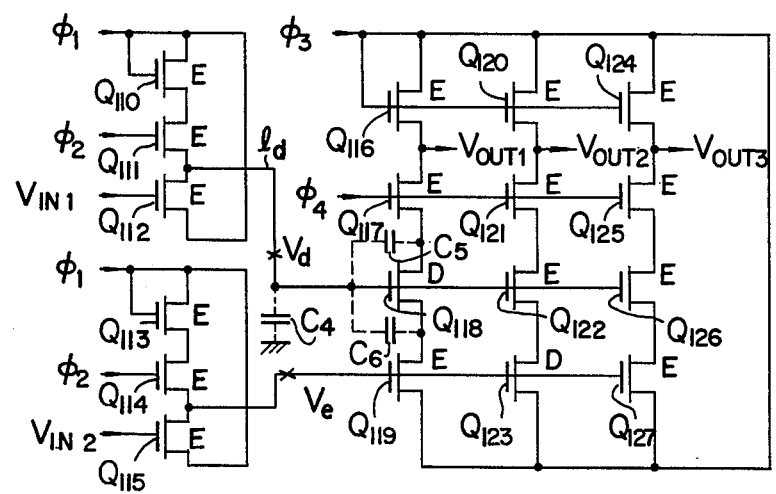
FIG. 3 is circuit diagram of another example of a ratioless type logic circuit.

In an ROM constituting a decoder circuit shown in FIG. 3, when the output signal $V_d$ of an inverter ($Q_{110}$–$Q_{112}$) for application as an input to the decoder is at a high level (0 volt), the precharge voltage according to the clock pulse signal $\phi_3$ drives the input conductor $l_d$ at the high level in the floating state to the low level ($-V\phi$ volts) through the gate capacitances $C_5$ and $C_6$ of a depletion mode FET $Q_{118}$. Since this signal $V_d$ falsely at the low level is also applied to other FETs $Q_{122}$ and $Q_{126}$ constituting a matrix, they are undersirably rendered ON as they are in enhancement mode as shown, although the signal $V_d$ should have been such as to render them non-conductive or OFF. And, since the FETs $Q_{123}$ and $Q_{127}$ in the logic block including the FET $Q_{122}$ and in the logic block including the FET $Q_{126}$ are in depletion mode and in enhancement mode respectively as shown, if the input signal $V_e$ renders the FET $Q_{127}$ ON, the decoder output signals $V_{OUT2}$ and $V_{OUT3}$ responsive to the input signals $V_d$ and $V_e$ are falsely at high levels.

The above problem of erroneous operation is applicable not only to a depletion mode FET but also to an enhancement mode FET having an Al gate, though the resulting adverse effects may be different, since the overlap capacitance between gate and source or between gate and drain is relatively large.

Now, the present invention will be described in detail by way of embodiment with the aid of the attached drawings.

Figure 7:
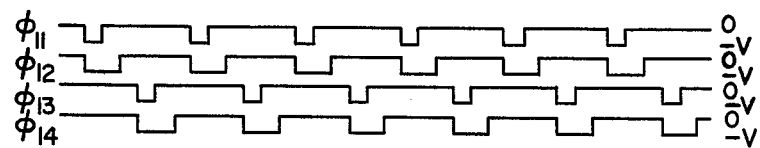
FIG. 7 is a waveform diagram of clock pulse signals which may be used in the circuits shown in FIGS. 4 and 6.
Figure 4:
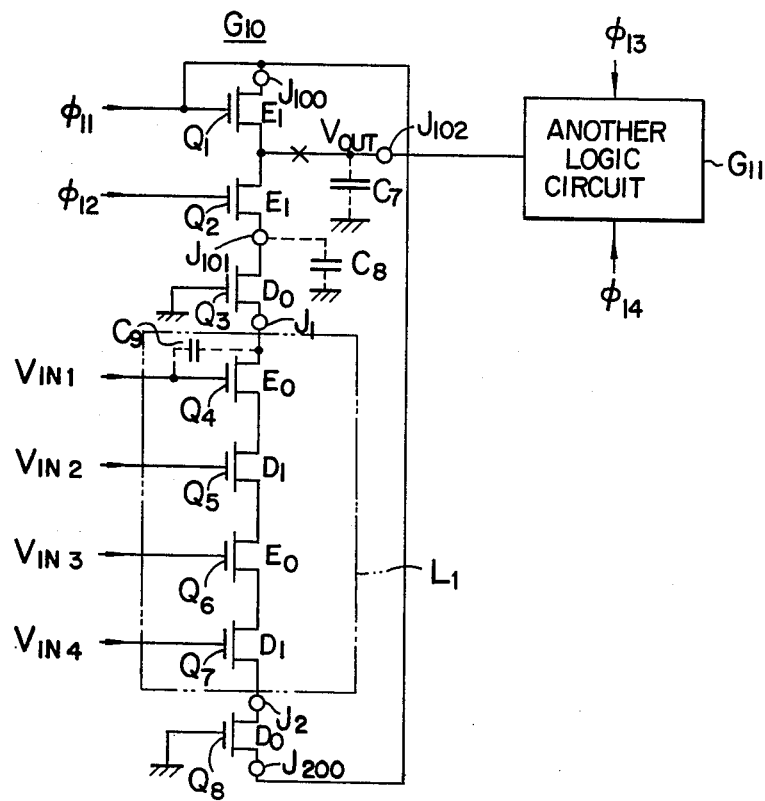
FIG. 4 is a circuit diagram of a ratioless type MIS logic circuit according to one embodiment of the present invention.
Figure 5:
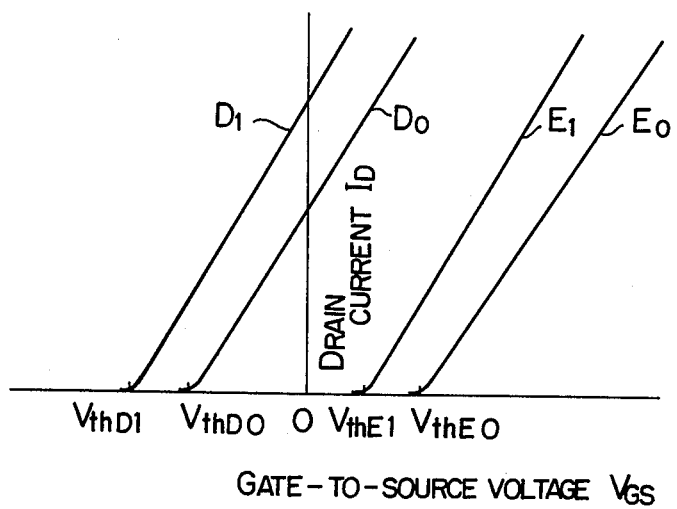
FIG. 5 shows characteristics of FETs which may be employed in the circuit shown in FIG. 4.

In FIG. 4 showing a multi-phase ratioless logic circuit in accordance with the present invention, connected between a first power feed terminal $J_{100}$ and an output node or an output terminal $J_{102}$ is a precharging P-channel enhancement mode FET $Q_1$, and connected between the output terminal $J_{102}$ and a node $J_{101}$ is a P-channel enhancement mode FET $Q_2$ for sensing a logical state. Those FETs $Q_1$ and $Q_2$ perform switching operations upon receipt of clock pulse signals $\phi_{11}$, $\phi_{12}$ and may have such characteristics as shown in FIG. 5, in which their threshold voltages $V_{thE1}$ are, e.g., $-1$ volt. A logic circuit block $L_1$ includes P-channel enhancement mode FETs $Q_4$ and $Q_6$ and P-channel depletion mode FETs $Q_5$ and $Q_7$, all connected in series, for example, as shown in FIG. 4. In the logic block $L_1$, the enhancement mode FETs $Q_4$ and $Q_6$ may have such characteristics as shown in FIG. 5, in which their threshold voltages $V_{thE0}$ are, e.g., $-2$ volts, which are selected to be larger in absolute value than the threshold voltages $V_{thE1}$ of the switching FETs $Q_1$ and $Q_2$. Meanwhile, the depletion mode FETs $Q_5$ and $Q_7$ may have such characteristics as shown in FIG. 5, in which their threshold voltages $V_{thD1}$ are, e.g., $+3$ volts. The depletion mode FETs $Q_5$ and $Q_7$ are used in the logic block $L_1$ in order to make the logic block $L_1$ insensitive to information signals $V_{IN2}$ and $V_{IN4}$ and sensitive only to information signals $V_{IN1}$ and $V_{IN3}$ so that the logic block $L_1$ is controlled by the signals $V_{IN1}$ and $V_{IN3}$. As will be apparent from the description of other embodiments of the present invention to be explained later, the use of the depletion mode FETs in the logic block affords an advantage that a geometrical layout is facilitated without requiring a special crossing interconnection technique. Connected with the two ends $J_1$ and $J_2$ of the logic block $L_1$ are first ends of P-channel depletion mode FETs $Q_3$ and $Q_8$ having their gates connected to a reference potential (e.g., ground potential). These depletion mode FETs may have such characteristics as shown in FIG. 5, in which their threshold voltages $V_{thD0}$ are, e.g., $+2$ volts, which are selected to be smaller in absolute value than the threshold voltages $V_{thD1}$ of the depletion mode FETs included in the logic block $L_1$. The second or the other end of the FET $Q_8$ is connected with a second power feed terminal $J_{200}$ while the second or the other end of the FET $Q_3$ is connected with the node $J_{101}$. In this embodiment, the second power feed terminal $J_{200}$ is directly connected with the first power feed terminal $J_{100}$. The clock pulse signals $\phi_{11}$ and $\phi_{12}$ may have waveforms show in FIG. 7 and are applied to the gates of the FETs $Q_1$ and $Q_2$, respectively. These clock pulse signals $\phi_{11}$ and $\phi_{12}$ have first cyclic periods (at $-V$ level, e.g. $-9$ volts) to render the FETs $Q_1$ and $Q_2$ conductive, respectively, and second cyclic periods (at 0 level, e.g., 0 volt) to render these transistors non-conductive. A capacitance $C_7$ (hereinafter referred to as an output capacitance) is connected between the output terminal $J_{102}$ and the reference potential source (e.g., the ground potential source). $C_8$ represents a stray capacitance.

In the operation of the logic circuit $G_{10}$, the output capacitance $C_7$ is precharged during the first periods of the clock pulse signal $\phi_{11}$. During the first periods of the clock pulse signal $\phi_{12}$, the logical state of the logic block $L_1$ is sensed and the sensed output determines the output voltage $V_{OUT}$ at the output terminal $J_{102}$. If both of the information signals $V_{IN1}$ and $V_{IN3}$ applied to the enhancement mode FETs $Q_4$ and $Q_6$ are at ON level ($-V$ level), during the first periods of the clock pulse signal $\phi_{12}$, the output capacitance $C_7$ having been precharged to voltage $-V$ is discharged through the FETs $Q_2$-$Q_7$ with a result that the output voltage $V_{OUT}$ at the output terminal $J_{102}$ is 0 volt. If at least one of the information signals $V_{IN1}$ and $V_{IN3}$ is at 0 level, the logic block is opened and the precharge voltage to which the output capacitance $C_7$ has been charged is maintained. The output voltage $V_{OUT}$ is applied to another logic circuit $G_{11}$ in the succeeding stage which is controlled by clock pulse signals $\phi_{13}$ and $\phi_{14}$ shown in FIG. 7.

In the logic circuit of the present invention described above, since the depletion mode FETs $Q_3$ and $Q_8$ having small threshold voltage values are connected with the ends $J_1$ and $J_2$ of the logic block $L_1$, the potentials at the ends $J_1$ and $J_2$ of the logic block are limited or clamped to the threshold voltage $V_{thD0}$ of the depletion mode FETs $Q_3$ and $Q_8$. For example, in the above example, if $V_{thD0} = +2$ volts, the potentials at the ends $J_1$ and $J_2$ of the logic block $L_1$ are $-2$ volts because the source voltage $V_S$ of an FET is generally given by $V_S = V_G - V_{th}$ where $V_G$ is a gate voltage and $V_{th}$ is the threshold voltage of the FET. Since the gates of the voltage clamping FETs $Q_3$ and $Q_8$ are grounded, the gate voltage $V_G$ is zero and the threshold voltage $V_{th}$ is equal to $+V_{thD0}$ because the FET is in depletion mode. As a result, the source voltage $V_S$ of the FETs $Q_3$ and $Q_8$, i.e. the potentials at the ends $J_1$ and $J_2$ are given by $V_S = V_G - V_{th} = 0 - (+V_{thD0}) = -V_{thD0}$. Thus, when $+V_{thD0} = +2$ volts, for example, the potentials at the ends $J_1$ and $J_2$ are $-2$ volts. In the present invention, the threshold voltage values for the FETs $Q_3$ and $Q_8$ are selected to be small so that the potentials at the terminals $J_1$ and $J_2$ assume small voltage values.

More particularly, the voltage appearing at the output terminal $J_{102}$ or the voltage appearing at the node $J_{101}$ is prevented from being fed back to the switching FETs $Q_4$-$Q_7$ in the logic block $L_1$. Similarly, the clock pulse signal $\phi_{11}$ applied to the second power feed terminal $J_{200}$ is prevented from being fed back or leaking to the logic block $L_1$. Furthermore, the leakage of undesired information voltage to the logic block $L_1$ from other information signal conductors (not shown) through stray capacitances is also provided.

Furthermore, in the present invention, since the enhancement mode switching FETs $Q_4$ and $Q_6$ used in the logic block $L_1$ have larger threshold voltage values $V_{thE0}$ than the threshold voltage values $V_{thE1}$ of the enhancement mode precharging FET $Q_1$ and the enhancement mode logical state sensing transistor $Q_2$, even when a voltage at the end $J_1$ of the logic block $L_1$ might be fed back to the gate of the switching FET $Q_4$ through a feedback capacitance formed by a stray capacitance $C_9$ such as a gate-to-drain capacitance or a gate-to-source capacitance parasitic in the FET $Q_4$, such feedback voltage actually does not affect the transistor $Q_4$ because the threshold voltage value thereof is sufficiently large.

In this manner, in the present invention, the malfunction of the logic block due to the undesired voltage feedback from the output to the input or the malfunction due to the leaking signal voltage from the clock pulse signal source or other information signal conductors can be prevented by the simultaneous use of the depletion mode clamping FETs ($Q_3$, $Q_8$) having small threshold voltage values $V_{thD0}$ and the enhancement mode FETs ($Q_4$, $Q_6$) in the logic block having large threshold voltage values $V_{thE0}$, the threshold voltage values $V_{thD1}$ of any depletion mode FETs in the logic block being larger than $V_{thD0}$ and the threshold voltages $V_{thE1}$ of the enhancement mode precharging FET and of the enhancement mode logical state sensing FET being smaller than $V_{thE0}$.

The arrangement of the present invention described above also affords improvements in the range of the operating power source voltage, the range of the operating frequencies of the clock pulse signals and the range of the operating temperature. In the circuit of FIG. 4, since the FETs $Q_1$ and $Q_2$ have small threshold voltage values $V_{thE1}$, a smaller amplitude source voltage (for $\phi_{11}$) may be used. Furthermore, since the threshold voltage values $V_{thE0}$ of the enhancement mode FETs $Q_4$ and $Q_6$ in the logic block $L_1$ is larger than those of the FETs $Q_1$ and $Q_2$, a larger amplitude source voltage (for $\phi_{11}$) may be used. As a result, in conjunction with the effect by the voltage clamping FETs $Q_3$ and $Q_8$, the range of operating source voltage can be expanded. Furthermore, since the depletion mode FETs $Q_5$ and $Q_7$ of the logic block have large threshold voltage values $V_{thD1}$, the discharge time for the output capacitance $C_7$ can be shortened and the range of the operating frequencies of the clock pulse signals ($\phi_{11}$, $\phi_{12}$) can be expanded. These expansions also result in the expansion of the range of the operating temperature for the logic circuit.

Figure 6:
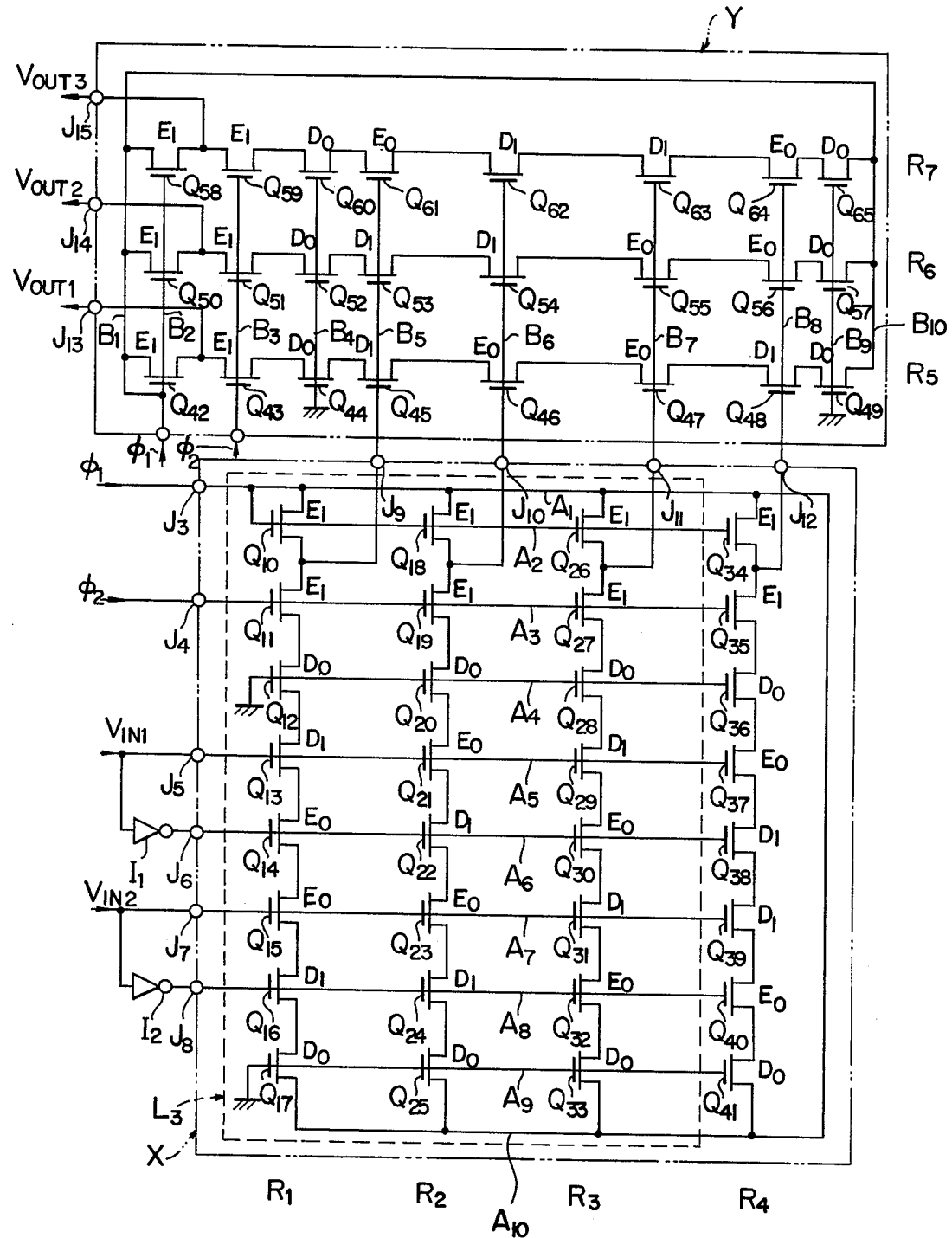
FIG. 6 is a circuit diagram of an ROM containing a ratioless type MIS logic circuit according to another embodiment of the present invention.

FIG. 6 shows another embodiment of the present invention in which the basic circuits shown in FIG. 4 are arranged in matrix to form an ROM (read only memory).

THe ROM comprises an address decoder ROM X and a memory matrix ROM Y. The address decoder ROM X comprises logic stages $R_1$, $R_2$, $R_3$ and $R_4$ similar to that shown in FIG. 4, arranged in column, and first clock pulse signal feed conductors $A_1$, $A_2$ and $A_{10}$, a second clock pulse signal feed conductor $A_3$, a plurality of word address signal feed conductors $A_5$-$A_8$ and reference potential feed conductors $A_4$ and $A_9$, each arranged to intersect the logic stages. Each of the conductors $A_2$-$A_9$ connects together the gates of the FETs of its associated logic stage.

Like the ROM X, the memory matrix ROM Y comprises logic stages $R_5$, $R_6$ and $R_7$ and conductors $B_1$-$B_{10}$ arranged in matrix. $I_1$ and $I_2$ denote inverters.

In operation, suppose that a ground potential is read out from the selected word address selector conductors $B_5$ and a voltage close to the source voltage ($\phi_1$) is read out from the unselected word address selector conductors $B_6$-$B_8$ in response to word address signals $V_{IN1}$ and $V_{IN2}$ at off-level and on-level respectively. Then, in the ROM Y, an FET $Q_{61}$ is turned off while FETs $Q_{46}$, $Q_{47}$, $Q_{55}$, $Q_{56}$ and $Q_{64}$ are turned on. As a result, a D.C. path is formed in the logic stage $R_5$ of the ROM Y because a depletion mode FET $Q_{45}$ in the logic stage $R_5$ is connected with the selected column $B_5$ and the FETs $Q_{46}$ and $Q_{47}$ in the logic stage $R_5$ are conducting. A D.C. path is also formed in the logic stage $R_6$ of the ROM Y because a depletion mode FET $Q_{53}$ in the logic stage $R_6$ is connected with the selected column $B_5$ and the enhancement mode FETs $Q_{55}$ and $Q_{56}$ in the logic stage $R_6$ are conducting. However, no D.C. path is formed in the logic stage $R_7$ of the ROM Y because an enhancement mode FET $Q_{61}$ in the logic stage $R_7$ which is non-conductive is connected with the selected column $B_5$. Thus, the ground potential is read out at bit output terminals $J_{13}$ and $J_{14}$ while the source voltage ($\phi_1$) is read out at bit output terminal $J_{15}$, as a fixed memory content.

In the ROM circuit according to the present invention described above, the logical circuits constituting the ROMs are not mutually interfered through the information signal feed conductors. In the above example, it is assumed that in the logic stage $R_1$ of the ROM Y the output node $J_9$ is driven to the source voltage level by the clock pulse signal $\phi_1$ which is either at a certain voltage level, e.g., $-9$ volts rendering an FET on or at a reference potential level, e.g., the ground level, rendering an FET off. The logic block in the logic stage $R_1$ including FETs $Q_{13}$-$Q_{16}$ has its ends connected with the depletion mode FETs $Q_{12}$ and $Q_{17}$ having small threshold voltage values, so that the voltages on the said ends of the logic block, i.e., those on the connection points between FETs $Q_{12}$ and $Q_{13}$ and between $Q_{16}$ and $Q_{17}$ are limited or clamped to the threshold voltage $V_{thD0}$ of the depletion mode FETs $Q_{12}$ and $Q_{17}$, for the same reasons set forth above in connection with FIG. 4. If the threshold voltages $V_{thD0}$ of the FETs $Q_{12}$ and $Q_{17}$ are $+2$ volts, the potentials on the ends of the logic block will be clamped to $-2$ volts. Furthermore, the enhancement mode FETs $Q_{14}$ and $Q_{15}$ in the logic block of the logic stage $R_1$ have threshold voltage values $V_{thE0}$ larger than those $V_{thE1}$ of the precharging enhancement mode FET $Q_{10}$ and of the logical state sensing enhancement mode FET $Q_{11}$, so that adverse effect of a feedback voltage from the output nodes of the ROM X to the address signal feed conductor $A_5$ through a stray capacitance such as a gate-to-drain capacitance or a gate-to-source capacitance parasitic in any of the FETs in the logic block can be prevented. For example, even if the voltage on the junction point between the FETs $Q_{12}$ and $Q_{13}$ might be fed back to the gate of the FET $Q_{21}$ in the adjacent logic stage $R_2$ through a stray capacitance, the FET $Q_{21}$ is not influenced by such feedback voltage since the threshold voltage value $V_{thE0}$ of the FET $Q_{21}$ is larger.

Further in FIG. 6, when an output voltage close to the source voltage is produced at the output terminal $J_{15}$ of the logic stage $R_7$ in the ROM Y, this output voltage is not fed back to the address selector conductor $B_5$ which is at the ground potential, because of the action of the depletion mode FET $Q_{60}$ having its gate grounded. Accordingly, the signal $V_{OUT3}$ is not fed back to the other logic stages $R_5$ and $R_{16}$ through the address selector conductor $B_5$.

Thus in the ROM circuit in the above embodiment shown in FIG. 6, any malfunction due to the undesired voltage feedback from the output to the input can be prevented by the use of the depletion mode clamping FETs having relatively small threshold voltage values and the enhancement mode FETs in the logic blocks having relatively large threshold voltage values, as in the case of FIG. 4.

Next, reference will be made to FIGS. 8, 9a-9e and 10 for describing a process for fabricating the above-mentioned ROM circuit including FETs with four different threshold values in a single silicon semiconductor substrate in an IC form, according to one embodiment of the present invention.

Figure 8:
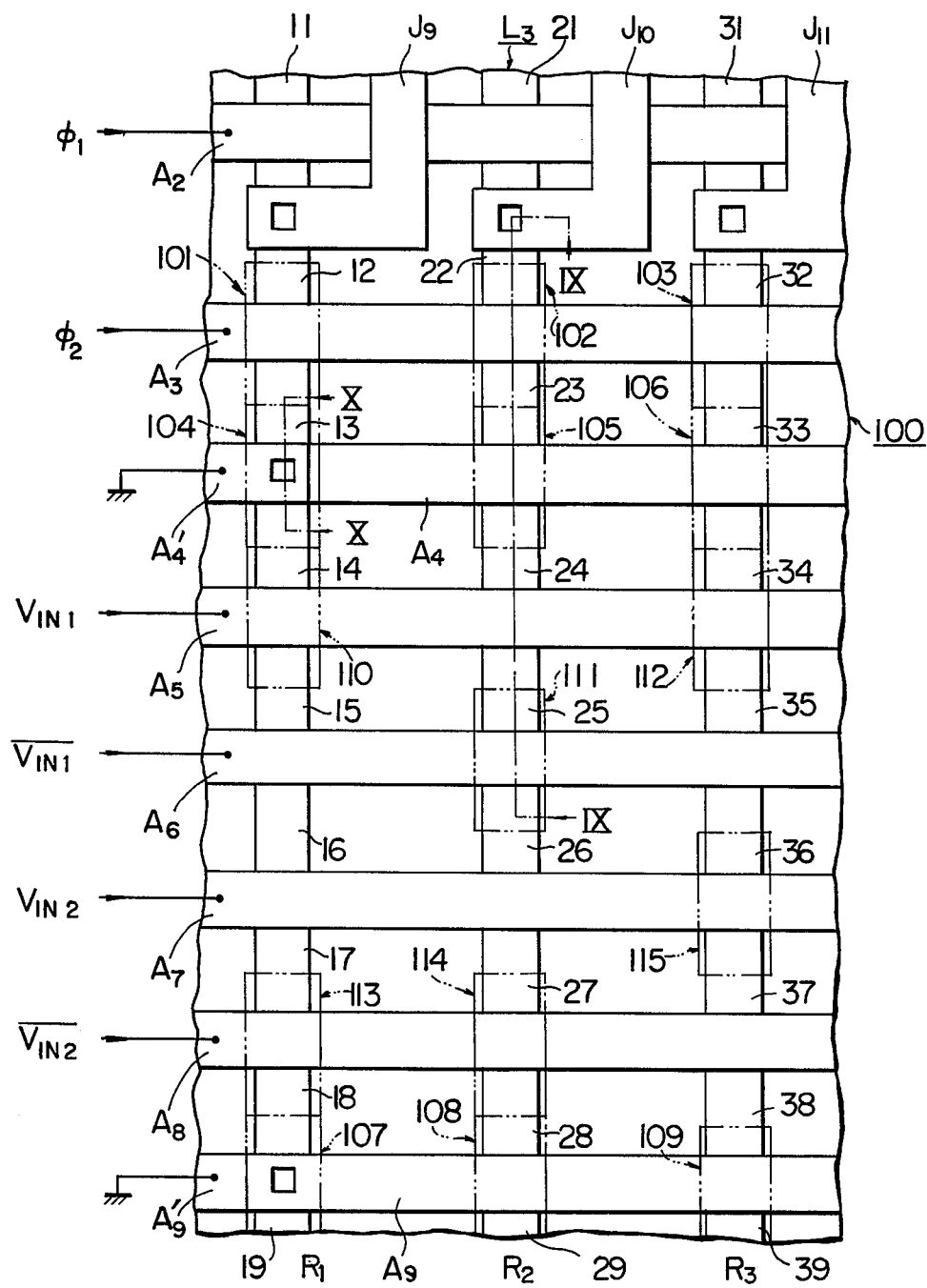
FIG. 8 is a plan view of a part of the ROM of FIG. 6 formed in an IC structure.
Figure 9A:
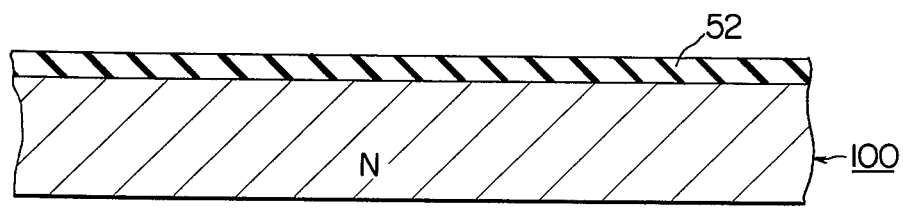
FIGS. 9a–9e are cross-sectional views showing various steps of a process for fabricating a semiconductor IC device according to one embodiment of the present invention.
Figure 9B:
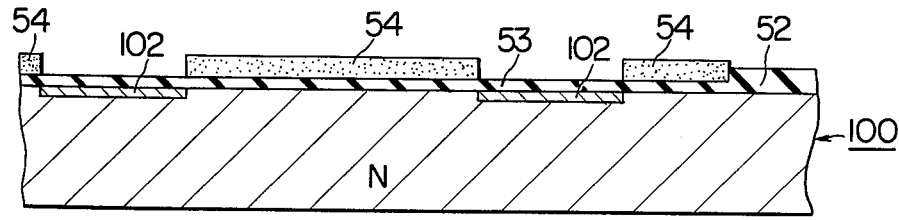
Figure 9C:
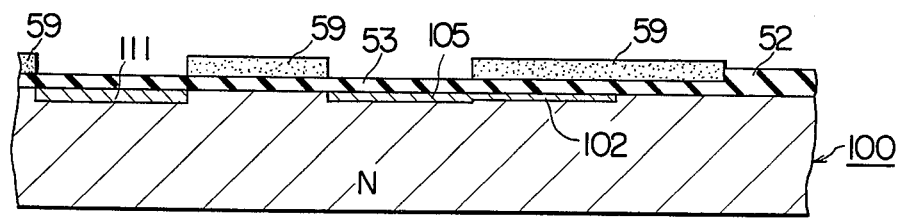
Figure 9D:
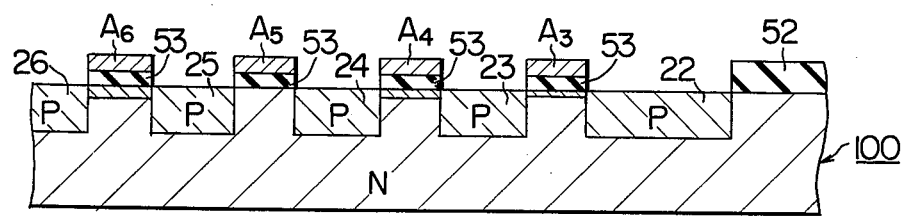

FIG. 8 shows a plan view of the ROM X shown in FIG. 6 fabricated in an IC form in a single silicon semiconductor substrate. FIG. 8 particularly shows the portion $L_3$ of the ROM X of FIG. 6. FIGS. 9a-9e show sectional views taken along a line IX—IX in FIG. 6, illustrating the process for fabricating the I.C. FIG. 10 shows a sectional view taken along a line X—X in FIG. 8.

Figure 9E:
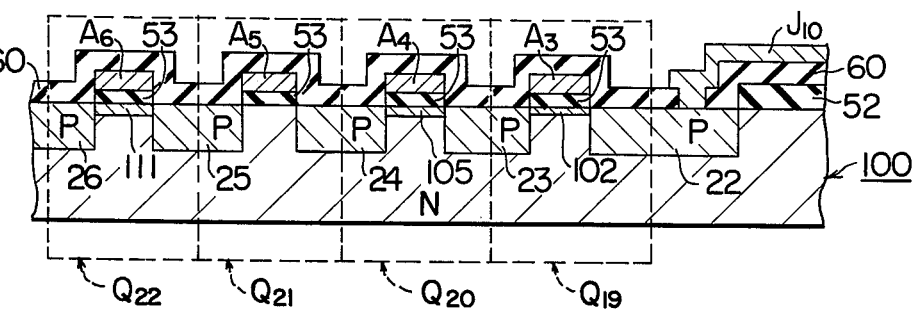
Figure 10:
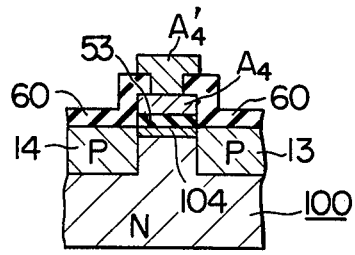
FIG. 10 is a cross-sectional view taken along line X—X in FIG. 8.

In FIG. 8 and FIG. 9e, numeral 100 denotes an N-type semiconductor substrate, $A_2$-$A_9$ denote polysilicon interconnection layers acting as gates of FETs and word address signal feed conductors, and numerals 11-19, 21-29 and 31-39 denote P-type diffusion regions which are self-aligned by the polysilicon interconnection layers $A_2$-$A_9$ and which act as sources or drains of the FETs. Numeral 53 denotes gate insulation layers made of silicon dioxide of substantially the same thickness (e.g. 1000 Å or 1200 Å), on which the polysilicon interconnection layers $A_2$-$A_9$ are disposed to form the gates. Numerals 101-109 denote regions formed by selectively implanting P-type impurity ions into the substrate surface. Of these regions, the regions 101-103 have a relatively low P-type impurity concentration and determine the first threshold voltage $V_{thE1}$ of the enhancement mode FETs shown in FIG. 5. The second threshold voltage $V_{thE0}$ of the enhancement mode FETs shown in FIG. 5 is determined by the impurity concentration of the semiconductor substrate itself. The regions 104-109 have a mean P-type impurity concentration higher than that of the regions 101-103 and form P-channel regions in the substrate surface. These regions determine the first threshold voltage $V_{thD0}$ of the depletion mode FETs shown in FIG. 5. The regions 110-115 have a relatively higher P-type impurity concentration than that of the regions 104-109. Like the regions 104-109, the regions 110-115 form P-channel regions in the substrate surface and determine the second threshold voltage $V_{thD1}$ of the depletion mode FETs shown in FIG. 5. Numeral 52 denotes a field insulation layer made of a relatively thick (e.g. 1-2 microns) silicon dioxide which covers the semiconductor substrate surface except those portions of the semiconductor substrate surface in which the P-type diffusion regions and on which the gate insulation layer 53 are formed. $A_4'$, and $A_9'$ denote aluminum interconnection layers which are in ohmic contact to the polysilicon interconnection layers. The ohmic contacts between the aluminum interconnection layers and the polysilicon interconnection layers are formed in a manner shown in FIG. 10. $J_9$-$J_{11}$ denote aluminum interconnection layers which are in ohmic contact to the P-type diffusion regions.

Now, the process for fabricating the ROM of the present invention will be explained with reference to FIGS. 9a-9e.

The $SiO_2$ film 52 (e.g., of N-type) of approximately 1.4 microns (having, e.g., a resistivity of 5-8 Ωcm) is formed on the surface of the Si monocrystal substrate 100 (FIG. 9a). Then, those portions of the $SiO_2$ film on the major surface of the substrate in which the FETs are to be formed are removed leaving slits, and the exposed substrate surface is oxidized to form thereon the thin $SiO_2$ film 53 (gate insulating oxide film) of approximately 1200 Å. A first pattern 54 of a photoresist film is formed thereon (FIG. 9b). Then, boron ions are implanted in the substrate surface with the pattern 54 used as a mask through the thin $SiO_2$ film 53 at a concentration of approximately $1.6 \times 10^{11}$ atoms/cm² to form the regions 102 (which determine the threshold voltage $V_{thE1}$ of FIG. 5). (FIG. 9b)

A photoresist material layer 59 is deposited on those areas of the thin oxide film 53 on the substrate surface on which depletion mode FETs are not to be formed. Using the photoresist layer 59 and the thick oxide film 52 as a second mask, which uncovers at least one of the regions 102 shown in FIG. 9b, and parts of the major surface in which regions 102 are not formed, boron ions are again implanted in the substrate surface through the exposed thin $SiO_2$ film at the concentration of $6.9 \times 10^{11}$ atoms/cm² to form the P-type regions 105 and 111 (FIG. 9c). Of those regions, the region 105 determines the first threshold voltage $V_{thD0}$ of the depletion mode FET shown in FIG. 5 while the region 111 has a higher P-type impurity concentration than the region 105 because ion implantation is effected therein in addition to the previous ion implantation and the region 111 determines the second threshold voltage $V_{thD1}$ of the depletion mode FET. Then, the photoresist layer 59 is removed and the polysilicon layer is deposited over the entire oxide layer to a thickness of approximately 5000 Å and the polycrystalline Si layer is removed except those portions on which is formed the address signal feed conductors, the reference potential feed conductors and the clock pulse signal feed conductors ($A_2$–$A_9$), the conductors being substantially in parallel with each other. (FIG. 9d). Then, using the remaining polycrystalline Si layers $A_3$–$A_6$ as a mask, the thin $SiO_2$ film 53 are removed to expose the substrate surface (FIG. 9d). Then, using the polycrystalline Si layers $A_3$–$A_6$ and the thick $SiO_2$ film 52 as a mask, boron is diffused by a conventional vapor-phase diffusion process into the exposed substrate surface to form the P⁺-diffusion regions 22–26 to a depth of approximately 0.8 $\mu$ (FIG. 9d). Thereafter, a phosphosilicate glass (PSG film) 60 of approximately 1 $\mu$ thickness is vapor-deposited to complete the MIS ROM shown in FIG. 9e.

In this manner, the FET $Q_{19}$ having a first threshold voltage $V_{thE1}$ (e.g., approximately −1 volt) of the enhancement mode FET shown in FIG. 5, the FET $Q_{21}$ having a second threshold voltage $V_{thE0}$ (e.g., approximately −2 volts) of the enhancement mode FET, the FET $Q_{20}$ having a first threshold voltage $V_{thD0}$ (e.g., approximately 2 volts) of the depletion mode FET, and the FET $Q_{22}$ having a second threshold voltage $V_{thD1}$ (e.g., approximately 3 volts) of the depletion mode FET can be formed.

According to the above manufacturing process, FETs having four different threshold voltages can be formed through double ion implantations of the P-type impurities. Furthermore, as is apparent from the embodiments of the present invention, it is possible to form FETs of $N^2$ different threshold voltages through N ion implantations.

Figure 11:
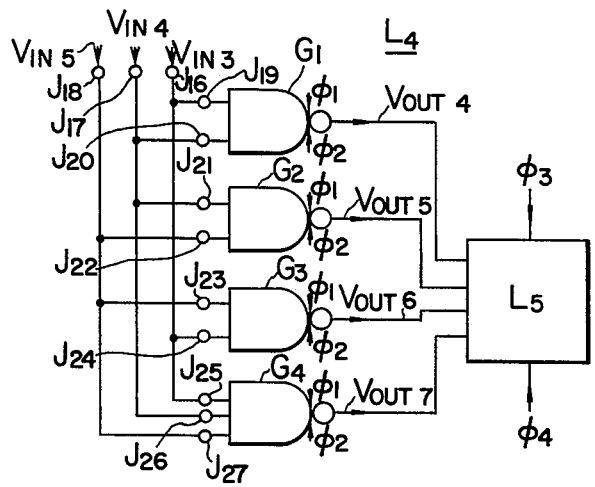
FIG. 11 is a block diagram of a logic circuit device containing a ratioless MIS logic circuit according to another embodiment of the present invention.
Figure 12:
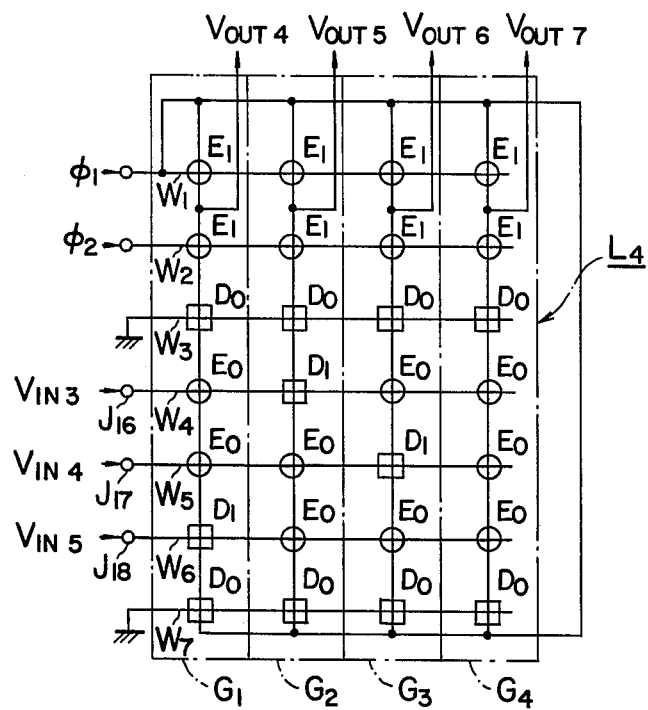
FIG. 12 is a schematic diagram of an array of components of the device shown in FIG. 11, according to the teaching of the present invention.

As is apparent from the above description concerning FIGS. 8 and 9a–9e, the logic circuit of FIG. 4 which uses the enhancement mode and depletion mode FETs is suitable to construct a matrix type logic circuit arrangement such as ROM using a number of such logic circuits, and it is very advantageous from a standpoint of the geometrical layout because the number of logic circuits can be very readily arranged in matrix by the use of depletion mode FETs without requiring any special cross-wiring. This matrix arrangement is applicable not only to the ROM but also to a logic circuit arrangement shown in FIG. 11 in which a plurality of NAND gates $G_1$–$G_4$ are connected to a plurality of input signal terminals $J_{16}$–$J_{18}$. In the latter case, the geometrical layout can be reduced. FIG. 12 schematically shows the section $L_4$ of the logic circuit of FIG. 11 which are arranged in matrix in accordance with the present invention.

In FIG. 12, the section $L_4$ is integrated in a silicon semiconductor substrate, and conductors $W_1$–$W_7$ comprise silicon wiring layers. P-type diffusion region of the NAND gate extend to intersect the conductors and FETs are formed at the intersections of the P-type diffusion region and the silicon wiring layers. Actually, the P-type diffusion regions do not intersect the silicon wiring layers in multi-layer wiring fashions.) Of the FETs, the depletion mode FETs are shown by squares while the enhancement mode transistors are shown by circles. Furthermore, of the depletion mode FETs, those FETs having relatively larger threshold voltage values are designated by $D_1$ while those having relatively smaller threshold voltage values are designated by $D_0$. Similarly, of the enhancement mode FETs, those having relatively larger threshold voltage values are designated by $E_0$ while those having relatively smaller threshold voltage values are designated by $E_1$. With the above arrangement, since the input signal conductors are arranged in rows and the NAND gate circuits are arranged in columns, the logic circuit arrangement can be constructed at a very high packing density.

Figure 13A:
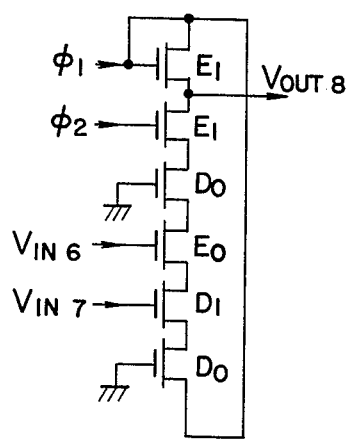
FIGS. 13a–13c are diagrams of a logic circuit according to the present invention and other logic circuits.
Figure 13B:
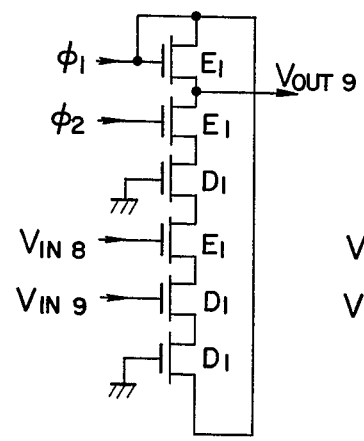
Figure 13C:
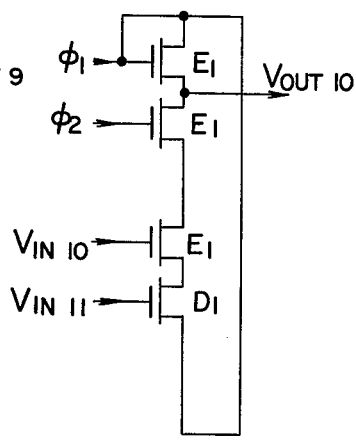
Figure 14:
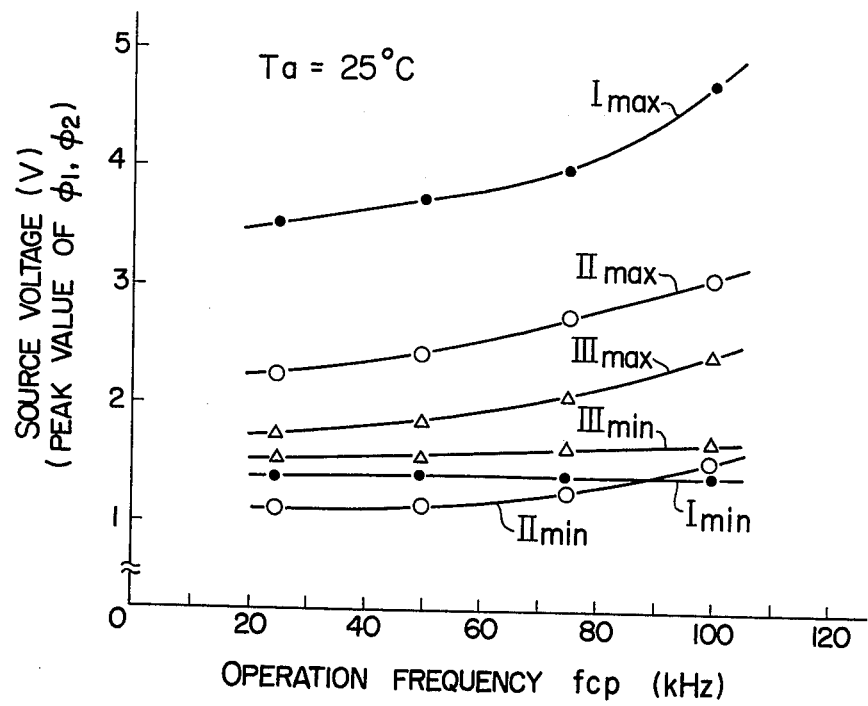
FIG. 14 is diagram illustrating the performance characteristics for their comparison.

FIG. 14 shows characteristics illustrating the range of operating supply voltage and the range of operating frequency for an eight-digit desk-top calculator logic circuit arrangement constructed by the logical gate circuits and the ROM of the present invention. FIG. 14 comparatively shows characteristics of two other similar logic circuit arrangements experimentarily used for comparison with the present arrangement at an ambient temperature $T_a = 25°$ C. That is, a comparison was made among a circuit arrangement which uses the present circuit shown in FIG. 13a as a basic circuit, and a circuit arrangement which uses a basic circuit shown in FIG. 13b, and a circuit arrangement which uses a basic circuit of FIG. 13c. In FIG. 14, $I_{max}$ and $I_{min}$ represent an upper limit and a lower limit, respectively, of the operable range of the source voltage when the circuit of the present invention was used. Similarly, $II_{max}$ and $II_{min}$ represent the upper limit and lower limit of the operable range of the source voltage for the circuit of FIG. 13b and $III_{max}$ and $III_{min}$ represent the upper limit and lower limit for the circuit of FIG. 13c.

It is apparent from the characteristics of FIG. 14 that the logic circuit arrangement of the present invention expands the range of the operating source voltage.

While the clock pulse signal source $\phi_{11}$ has been used as the precharge voltage source in the above description of the present invention, a D.C. power source may be used in place of the clock pulse signal source as the precharge voltage source. In this case, in the circuit of FIG. 4, the drain of the FET $Q_1$ is isolated from the gate thereof and from the FET $Q_8$ but connected to the D.C. source while the node $J_2$ is grounded. Furthermore, various modifications of the present invention can be effected without departing from the spirit of the invention.

We claim:

1. A ratioless type MIS logic circuit comprising:
   at least one input terminal and an output terminal;
   a logic block including at least one depletion mode FET having its gate connected with said input terminal and inherently having a gate-to-source parasitic capacitance and a gate-to-drain parasitic capacitance;
   an output capacitance connected between said output terminal and a reference potential source;
   means arranged for precharging said output capacitance;
   means for sensing the logical state of said logic block, said precharging means and said sensing means being operative in a timed relation with each other; and first and second depletion mode FETs connected with one end and the other end of said logic block, repsectively, for suppressing electrical energy which tends to be fed back from said output terminal to said input terminal through said parasitic capacitances, the gates of said first and second suppressing depletion mode transistors being connected with said reference potential source, the threshold voltage value of said at least one depletion mode FET in said logic block being larger than those of said suppressing first and second depletion mode FETs.

2. A ratioless type MIS logic circuit according to claim 1, in which each of said precharging means and said sensing means includes an enhancement mode FET and said logic block includes at least one depletion mode FET and at least one enhancement mode FET connected with each other and having their gates connected with different input terminals, the threshold voltage value of said enhancement mode FET in said logic block being larger than those of said enhancement mode FETs in said precharging means and said sensing means.

3. A ratioless type MIS logic circuit comprising:
first and second power feed terminals;
at least one logic block including at least one depletion mode FET and at least one enhancement mode FET connected in series;
a series circuit of first and second enhancement mode FETs provided one for each said logic block and connected at its one end with said first power feed terminal;
an output capacitance provided one for each said logic block and connected between the junction point of said series-connected first and second enhancement mode FETs and a reference potential source;
a first clamping depletion mode FET provided one for each said logic block and interconnected between the other end of said series circuit of sid first and second enhancement mode FETs and one end of said logic block;
a second clamping depletion mode FET provided one for each said logic block and interconnected between the other end of said logic block and said second power feed terminal;
the threshold voltage values of the depletion mode FET and of the enhancement mode FET in said logic block being larger then those of said clamping depletion mode FETs and of said series-connected first and second enhancement mode FETs, respectively, and the gates of said first and second clamping FETs being connected with said reference potential source;

means for applying first and second clock pulse signals to said first and second enhancement mode FETs, respectively, for precharging said output capacitance and sensing the logical state of said logic block; and information signal input terminals connected with different gates of said FETs in said logic block.

4. A ratioless type MIS logic circuit according to claim 3, in which said first and second power feed terminals are connected with one of said means for applying said first and second clock pulse signals.

5. A ratioless type MIS logic circuit comprising:
first and second clock pulse signal feed conductors arranged substantially in parallel with each other;
a plurality of information signal feed conductors arranged substantially in parallel with said first and second clock pulse signal feed conductors;
first and second reference potential feed conductors arranged substantially in parallel with said clock pulse signal feed conductors and with said information signal feed conductors, said first reference potential feed conductor being disposed between said first clock pulse signal feed conductor and said information signal feed conductors, and said second reference potential feed conductor being disposed between said information signal feed conductors and the second clock pulse signal feed conductor; and
a plurality of logic stages each including a plurality of FETs connected in series with each other and arranged substantially perpendicular to said pulse signal feed conductors and to said information signal feed conductors, those of said FETs which are connected with said clock pulse signal feed conductors being in enhancement mode, those of said FETs which are connected with said reference potential feed conductors being in depletion mode, at least one of those of said FETs which are connected with said information signal feed conductors being in enhancement mode, at least one of said logic stages including at least one depletion mode FET;
the threshold voltage value of the depletion mode FET connected with one of said information signal feed conductors being larger than those of the depletion mode FETs connected with said reference potential feed conductors, and the threshold voltage values of the enhancement mode FETs connected with said information signal feed conductors being larger than those of the enhancement mode FETs connected with said clock pulse signal feed conductors.

* * * * *